United States Patent
Su

(10) Patent No.: US 8,923,920 B2
(45) Date of Patent: Dec. 30, 2014

(54) TEST DEVICE AND TEST METHOD FOR MULTIMEDIA DATA CARD AND MOBILE-PHONE MULTIMEDIA DATA CARD

(75) Inventor: Haibo Su, Huizhou (CN)

(73) Assignee: Huizhou TCL Mobile Communication Co., Ltd., Huizhou, Guangdong Province (CN)

( * ) Notice: Subject to any disclaimer, the term of this patent is extended or adjusted under 35 U.S.C. 154(b) by 618 days.

(21) Appl. No.: 13/265,331

(22) PCT Filed: Jun. 25, 2010

(86) PCT No.: PCT/CN2010/074493
§ 371 (c)(1),
(2), (4) Date: Oct. 19, 2011

(87) PCT Pub. No.: WO2011/044777
PCT Pub. Date: Apr. 21, 2011

(65) Prior Publication Data
US 2012/0032698 A1 Feb. 9, 2012

(30) Foreign Application Priority Data
Oct. 16, 2009 (CN) .......................... 2009 1 0110514

(51) Int. Cl.
*H04B 1/38* (2006.01)
*H04M 1/00* (2006.01)
*G01R 31/28* (2006.01)

(52) U.S. Cl.
CPC .................................. *G01R 31/2808* (2013.01)
USPC ........... 455/558; 455/557; 455/551; 455/90.1

(58) Field of Classification Search
CPC ........................ H04M 2250/14; G06F 11/2221
USPC .......... 455/556.1, 558, 557, 550.1, 551, 90.1, 455/67.11, 556.2; 714/718, 25, 724, 42; 702/117
See application file for complete search history.

(56) References Cited

U.S. PATENT DOCUMENTS

| | | | |
|---|---|---|---|
| 7,331,001 B2 * | 2/2008 | Kao et al. | 714/25 |
| 7,359,204 B1 * | 4/2008 | Jang et al. | 361/715 |
| 8,667,345 B2 * | 3/2014 | Chang et al. | 714/718 |
| 2009/0236430 A1 * | 9/2009 | Webb et al. | 235/492 |

FOREIGN PATENT DOCUMENTS

| | | |
|---|---|---|
| CN | 2819688 Y | 9/2006 |
| CN | 201011718 Y | 1/2008 |
| CN | 101458297 A | 6/2009 |
| CN | 101697599 A | 4/2010 |
| DE | 4337500 A1 | 5/1995 |

\* cited by examiner

*Primary Examiner* — John J Lee
(74) *Attorney, Agent, or Firm* — Cheng-Ju Chiang

(57) ABSTRACT

The present invention discloses a test device and a test method for a multimedia data card and a mobile-phone multimedia data card. The test device comprises a printed circuit board (PCB), and the PCB is provided with a connecting slot module that can be split and used for connecting modules under test. The test device for a multimedia data card comprises a miniature connector, which is plugged into the connecting slot module. According to the present invention, the PCB can be tested simply by connecting the PCB tester to the miniature USB connector, and the components can be easily plugged in without need of such operations as windowing and positioning. Therefore, the test efficiency is improved, and because the cost for developing test clamps to connect these test points is saved, the test cost and the manufacturing cost get reduced.

9 Claims, 2 Drawing Sheets

TEST DEVICE AND TEST METHOD FOR MULTIMEDIA DATA CARD AND MOBILE-PHONE MULTIMEDIA DATA CARD

CROSS REFERENCE TO RELATED APPLICATIONS

The present application is a 35 U.S.C. §371 National Phase conversion of International (PCT) Patent Application No. PCT/CN2010/074493, filed on Jun. 25, 2010, the disclosure of which is incorporated by reference herein. The PCT International Patent Application was published in Chinese.

TECHNICAL FIELD

The present invention generally relates to a test device and a test method for a multimedia data card, and particularly, to a test device and a test method for a multimedia data card and a mobile-phone multimedia data card.

BACKGROUND

Currently, the Time Division-Synchronous Code Division Multiple Access (TD-SCDMA) technology is evolving towards the TD-Long Term Evolution (TD-LTE) technology at an amazing speed in China, and application functions thereof are increasingly enhanced. As the 3G industry is being developed rapidly in China nowadays, the market for enhanced multimedia data cards is very promising.

Products currently developed support multi-mode applications such as TD-SCDMA/HSDPA/HSUPA/GSM/DCS, and also support multimedia broadcasting services. Because of the many comprehensive applications, the space in the layout and structural design of a printed circuit board (PCB) becomes much valuable for a data card; morover, data card terminals are now developing towards slim and compact profiles (e.g., towards a miniature profile or a USB-drive form). This imposes a hightened requirement on the PCB and the structural and layout design. However, during the development and design of the product, Joint Test Action Group (JTAG) and other necessary system status parameter monitoring points of ARM microprocessors (i.e., a series of microprocessors manufactured by Advanced RISC Machines Company) and Digital Signal Processing (DSP) microprocessors which are connected to a baseband chip of the data card are needed to be tracked and tested for the development of software and hardware as a new design application. Those test points usually amount to about 10, and this needs to occupy a sufficient space on the surface of the PCB of the data card to arrange the test points, which adds to the difficulty in achieving a compact layout of the PCB. Moreover, a window has to be formed in an enclosure of the data card so that, via the window of the enclosure, test clamps can be well positioned to make contact with the test points of the PCB within the enclosure. However, this not only makes the structural design of the PCB more complex but also has an adverse influence on the appearance of the data card, thereby significantly affecting the overall planning of the product as well as the competitive power of the product in the market.

China Patent Publication No. CN101458297Y discloses "TEST SYSTEM AND TEST METHOD FOR PCB", according to which the PCB is tested by using test clamps to fix test points on the PCB and providing a window-like structure on an enclosure of a mobile phone. The aforesaid test process is very complicated. Moreover, before each of the test points is tested, the test point has to be re-positioned by using a corresponding test clamp, which increases the manufacturing cost and lowering the test efficiency. Accordingly, the prior art needs to be further improved.

SUMMARY OF THE INVENTION

In order to overcome the disadvantages of the prior art, the present invention provides a test device and a test method for a multimedia data card and a mobile-phone multimedia data card. By making reasonable improvements on the test device and the test method of the prior art, the test procedure is simplified, the test efficiency is improved and the test cost is reduced.

To solve the aforesaid technical problem, the present invention adopts the following solutions.

A test device for a multimedia data card, the test device comprising a printed circuit board (PCB), wherein the PCB is provided with a connecting slot module that can be split and used for connecting modules under test, and the connecting slot module is provided with a plurality of connecting slots, each of which is uniquely connected with one of the modules under test.

The test device for a multimedia data card comprises a miniature connector, which is provided with a connecting pin module at an end thereof and connected with a PCB tester at the other end thereof, the connecting pin module is adapted to mate with the connecting slot module, and the miniature connector is plugged into the connecting slot module.

In the test device, the miniature connector is a miniature USB connector, and a USB interface of the miniature USB connector is adapted to connect with the PCB tester.

In the test device, an enclosure of the multimedia data card is formed with a through-hole at a position corresponding to the connecting slot module; and the connecting pin module is inserted through the through-hole to be plugged into the connecting slot module.

A test device for a mobile-phone multimedia data card, the test device comprising a PCB, wherein the PCB is provided with a connecting slot module that can be split and used for connecting modules under test, and the connecting slot module is provided with a plurality of connecting slots, each of which is uniquely connected with one of the modules under test.

The test device for a mobile-phone multimedia data card comprises a miniature connector, which is provided with a connecting pin module at an end thereof and connected with a PCB tester at the other end thereof, the connecting pin module is adapted to mate with the connecting slot module, and the miniature connector is plugged into the connecting slot module.

In the test device for a mobile-phone multimedia data card, the miniature connector is a miniature USB connector, and a USB interface of the miniature USB connector is adapted to connect with the PCB tester.

In the test device for a mobile-phone multimedia data card, an enclosure of the mobile-phone multimedia data card is formed with a through-hole at a position corresponding to the connecting slot module; and the connecting pin module is inserted through the through-hole to be plugged into the connecting slot module.

A test method for a multimedia data card, mainly comprising the following steps of:

A. using a connecting slot module to transmit data from modules under test to a PCB tester via a miniature connector; and B. using the PCB tester to process the data and, upon the test is completed by the PCB tester, removing the connecting slot module and the miniature connector from the PCB so as to assemble the multimedia data card.

In the test method, in the step B, the PCB tester performs a Joint Test Action Group (JTAG) test on the modules under test.

The present invention provides a test device and a test method for a multimedia data card and a mobile-phone multimedia data card. The PCB is provided with the connecting slot module adapted to connect with the miniature USB connector. Then, by connecting the PCB tester to the miniature USB connector, the PCB can be tested with an improved test efficiency. In the aforesaid process, the fragmentary spaces on the PCB are fully used to arrange the connecting slot module and the miniature USB connector, so the requirement on the spatial arrangement of the PCB is reduced and the tester is more stably connected with the test points. Moreover, this eliminates the need of manufacturing test clamps, so the cost of developting the test clamps to connect these test points is saved. After the test is completed, the miniature USB connector is removed, which can improve the aesthetics of the whole mobile phone after being assembled.

BRIEF DESCRIPTION OF THE DRAWINGS

The components in the drawings are not necessarily drawn to scale, the emphasis instead being placed upon clearly illustrating the principles of at least one embodiment of the present invention. In the drawings, like reference numerals designate corresponding parts throughout various views, and all the views are schematic.

DETAILED DESCRIPTION OF EMBODIMENTS

Reference will now be made to the drawings to describe preferred and exemplary embodiments of the present invention in detail.

The present invention provides a test device and a test method for a multimedia data card and a mobile-phone multimedia data card. According to the present invention, by arranging a miniature USB connector in the fragmental spaces on a printed circuit board (PCB), the PCB can be tested via the miniature USB connector. This reduces the requirement on the spatial arrangement of the PCB, reduces the number of operation steps, improves the test efficiency and saves the test cost.

During the development of mobile phones, JTAG and other common system status parameter monitoring points of ARM and DSP microprocessors of chips have to be frequently monitored and tested. This is necessary in the development stage; however, these test interfaces are useless and unwanted for users. Therefore, the design conception of the present invention is to retain the test interfaces in the development stage of the product and flexibly remove the test interfaces when the product is delivered so as not to affect the structure, appearance and function of the product. Based on the aforesaid conception, the present invention arranges a miniature USB connector in the fragmental spaces on a PCB and connects test points that are most commonly used in the development stage to the miniature USB connector; on the other hand, existence of the miniature USB connector is disregarded in the appearance and structure design. Thus, when testing the multimedia data card, an operator just needs to perforate a front surface of an enclosure of the multimedia data card at a position corresponding to the miniature USB connector, and insert testing wires into a USB interface of the miniature USB connector when it is needed to connect the test points. In this way, the testing wires can be plugged in easily and connected stably, and the cost of developing test clamps is saved. After the product is tested, the miniature USB connector in the product is removed as the users will not use these test points. This effectively makes a compromise between the development demand and the product strategy, which helps to accomplish the product strategy.

Figure 1:
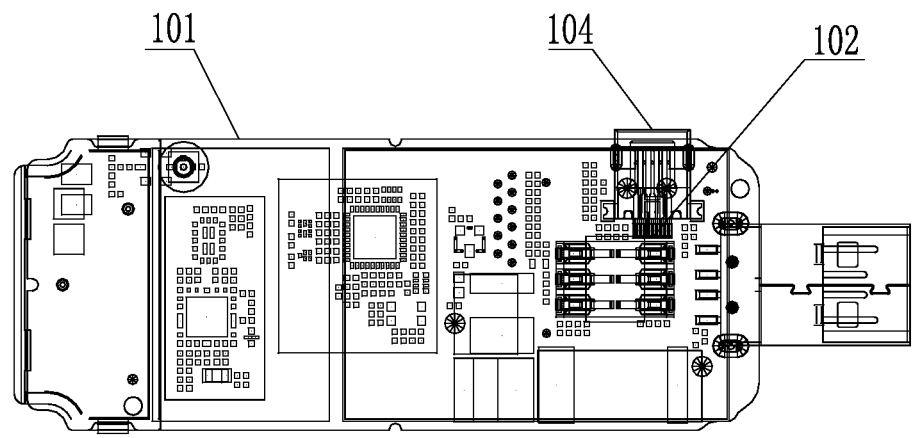
FIG. 1 is a schematic view illustrating a partial structure of a test device for a multimedia data card according to the present invention.
Figure 2:
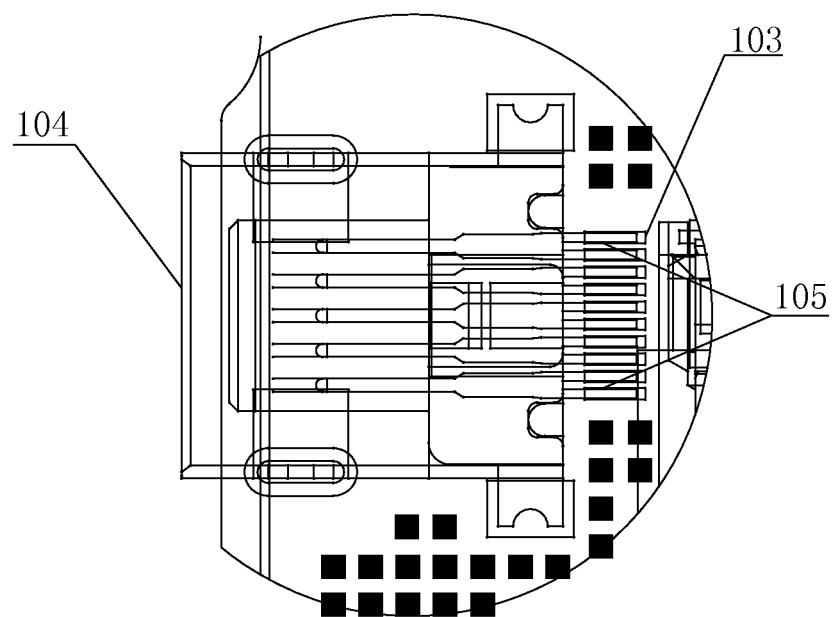
FIG. 2 is a schematic view illustrating a partial structure when a miniature connector is plugged into a connecting slot module according to the present invention.

As shown in FIG. 1 and FIG. 2, the test device for a multimedia data card of the present invention comprises a PCB 101. The PCB 101 is provided with a connecting slot module 102 that can be split and used for connecting modules under test. The connecting slot module 102 is provided with a plurality of connecting slots 103, each of which is uniquely connected with one of the modules under test. The test device for a multimedia data card comprises a miniature connector 104, which is provided with a connecting pin module 105 at an end thereof and connected with a PCB tester at the other end thereof. The connecting pin module 105 is adapted to mate with the connecting slot module 102, and the miniature connector 104 is plugged into the connecting slot module 102. The PCB tester can be easily connected with the miniature connector according to the prior art, and thus is not shown in FIG. 1. Furthermore, in the aforesaid test device for a multimedia data card, the miniature connector 104 is usually a miniature USB connector; and typically, prior art miniature USB connectors have a low cost, provide a stable connection and are easy to operate. An enclosure of the multimedia data card is formed with a through-hole at a position corresponding to the connecting slot module 102; and the connecting pin module is inserted through the through-hole to be plugged into the connecting slot module 102. The present invention is mainly used to perform a JTAG test on the PCB, i.e., perform a boundary scan test on a circuit of the PCB and a test on a system program of a programmable chip. As can be known from the above description, the PCB can be tested simply by connecting the PCB tester to the miniature USB connector without having to perform such operations as windowing and positioning; in this way, the test efficiency is improved, and because the cost of developing test clamps to connect these test points is saved, the test cost and the manufacturing cost are lowered.

The present invention can apply the aforesaid test device for a multimedia data card to a mobile phone. In this case, the specific structure of the test device for a mobile-phone multimedia data card is substantially identical to that of the aforesaid test device for a multimedia data card, and thus will also be described with reference to FIG. 1 and FIG. 2 herein. The test device for a mobile-phone multimedia data card comprises a PCB 101. The PCB 101 is provided with a connecting slot module 102 that can be split and used for connecting modules under test. The connecting slot module 102 is provided with a plurality of connecting slots 103, each of which is uniquely connected with one of the modules under test. The test device for a mobile-phone multimedia data card comprises a miniature connector 104, which is provided with a connecting pin module 105 at an end thereof and connected with a PCB tester at the other end thereof. The connecting pin module 105 is adapted to mate with the connecting slot module 102, and the miniature connector 104 is plugged into the connecting slot module 102. Furthermore, in the aforesaid test device for a mobile-phone multimedia data card, the miniature connector 104 is usually a miniature USB connector; and typically, prior art miniature USB connectors have a low cost, provide a stable connection and are easy to operate. An enclosure of the mobile-phone multimedia data card is formed with a through-hole at a position corresponding to the connecting slot module 102; and the connecting pin module is inserted through the through-hole to be plugged into the connecting slot module 102. The present invention is mainly used to perform a JTAG test on the PCB, i.e., perform a boundary scan test on a circuit of the PCB and a test on a system program of a programmable chip.

Figure 3:
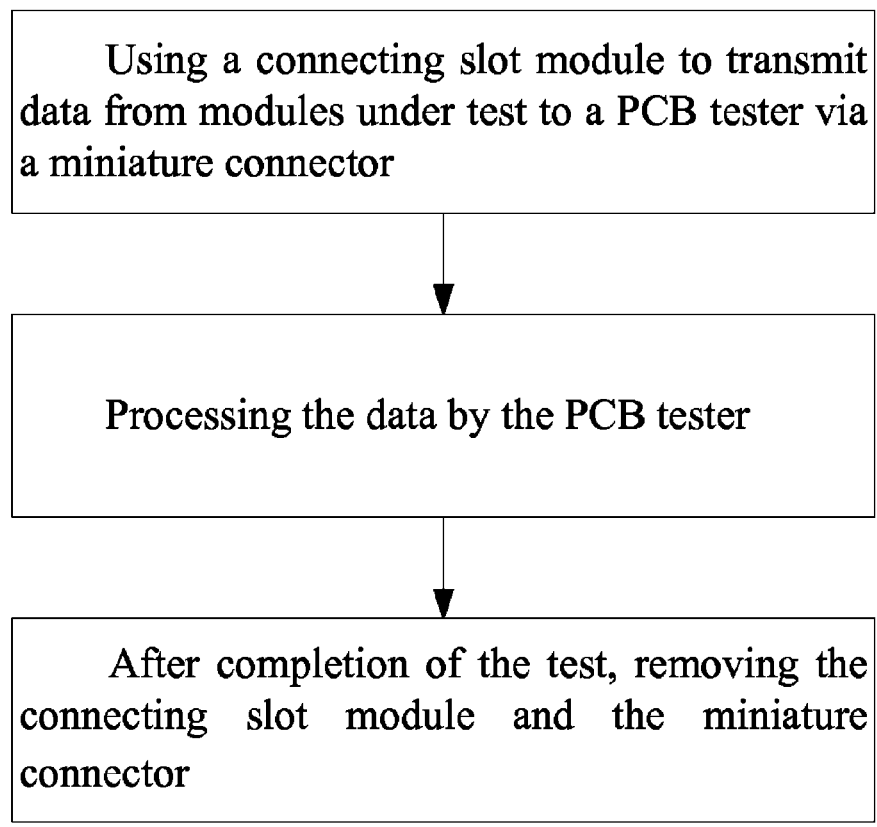
FIG. 3 is a schematic view illustrating a process flow of testing the multimedia data card according to the present invention.

As shown in FIG. 3, the test method for a multimedia data card provided by the present invention mainly comprises the following steps of:

a. using a connecting slot module to transmit data from modules under test to a PCB tester via a miniature connector;

b. using the PCB tester to process the data; and c. after the test is completed by the PCB tester, removing the connecting slot module and the miniature connector from the PCB so as to assemble the multimedia data card. In the step b, the PCB tester performs a JTAG test on the modules under test. As can be known from the above description, in the test method of the present invention, after the test on the PCB is completed, the connecting slot module and the miniature connector are removed to reduce the requirement on the spatial arrangement of the PCB. In this way, because the cost of developing test clamps to connect these test points is saved, the test cost and the manufacturing cost are reduced; and this also makes plugging-in of the PCB, the connecting slot module and the miniature connector very convenient, thus improving the test efficiency and the test accuracy.

In the present invention, the following steps may be followed in a process of plugging in the modules to perform the test:

d. placing a miniature connector on the PCB, and connecting the modules under test to the miniature connector via the connecting slot module;

e. perforating a front surface of an enclosure of the multimedia data card at a position corresponding to the connecting slot module, and then connecting the PCB tester to the miniature connector;

f. after the PCB tester is connected to the miniature connector, testing the modules under test; and g. after the test in step f is completed, disconnecting the miniature connector from the modules under test, and removing the connecting slot module and the miniature connector from the PCB. As can be known from the above description, the PCB can be tested simply by connecting the PCB tester to the miniature USB connector without having to perform such operations as windowing and positioning, thereby improving the test efficiency. After the test is completed, the miniature USB connector is removed before the mobile phone is assembled, so the aesthetics of the whole mobile phone is improved and the requirement on the spatial arrangement of the PCB is reduced to save the developing cost. Moreover, because the cost of developing testing clamps to connect these test points is saved, the test cost and the manufacturing cost are reduced.

According to the above descriptions, with the test methods for a multimedia data card and a mobile-phone multimedia data card provided by the present invention, the PCB can be tested by arranging the miniature USB connector in the fragmental spaces on the PCB, connecting the modules under test to the miniature USB connector via the connecting slot module and then connecting the PCB tester with the miniature USB connector; and after the test is completed, the connecting slot module and the miniature USB connector are removed. Compared to the prior art, this method has the following advantages: the components can be easily plugged without having to perform such operations as windowing and positioning, so the test efficiency is improved and the requirement on the spatial arrangement of the PCB is reduced to save the developing cost; because the cost for developing test clamps to connect these test points is saved, the test cost and the manufacturing cost are reduced; and because the miniature USB connector is finally removed instead of occupying a space within the mobile phone, the aesthetics of the whole mobile phone is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A test device for a multimedia data card, the test device comprising a printed circuit board (PCB), wherein the PCB is provided with a connecting slot module that is separable and used for connecting modules under test, and the connecting slot module is provided with a plurality of connecting slots, each of which is uniquely connected with one of the modules under test; and the test device for a multimedia data card comprises a miniature connector, which is provided with a connecting pin module at an end thereof and connected with a PCB tester at the other end thereof, the connecting pin module is adapted to mate with the connecting slot module, and the miniature connector is plugged into the connecting slot module.

2. The test device of claim 1, wherein the miniature connector is a miniature universal serial bus (USB) connector, and a USB interface of the miniature USB connector is adapted to connect with the PCB tester.

3. The test device of claim 2, wherein an enclosure of the multimedia data card is formed with a through-hole at a position corresponding to the connecting slot module; and the connecting pin module is inserted through the through-hole to be plugged into the connecting slot module.

4. The test device of claim 1, wherein an enclosure of the multimedia data card is formed with a through-hole at a position corresponding to the connecting slot module; and the connecting pin module is inserted through the through-hole to be plugged into the connecting slot module.

5. A test device for a mobile-phone multimedia data card, the test device comprising a printed circuit board (PCB), wherein the PCB is provided with a connecting slot module that is separable and used for connecting modules under test, and the connecting slot module is provided with a plurality of connecting slots, each of which is uniquely connected with one of the modules under test; and the test device for a mobile-phone multimedia data card comprises a miniature connector, which is provided with a connecting pin module at an end thereof and connected with a PCB tester at the other end thereof, the connecting pin module is adapted to mate with the connecting slot module, and the miniature connector is plugged into the connecting slot module.

6. The test device for a mobile-phone multimedia data card of claim 5, wherein the miniature connector is a miniature universal serial bus (USB) connector, and a USB interface of the miniature USB connector is adapted to connect with the PCB tester.

7. The test device for a mobile-phone multimedia data card of claim 6, wherein an enclosure of the mobile-phone multimedia data card is formed with a through-hole at a position corresponding to the connecting slot module; and the connecting pin module is inserted through the through-hole to be plugged into the connecting slot module.

8. A test method for a multimedia data card, mainly comprising the following steps of:
   A. using a connecting slot module to transmit data from modules under test to a printed circuit board (PCB) tester via a miniature connector; and
   B. using the PCB tester to process the data and, upon completion of the test by the PCB tester, removing the connecting slot module and the miniature connector from the PCB to assemble the multimedia data card.

9. The test method of claim 8, wherein in the step B, the PCB tester performs a Joint Test Action Group (JTAG) test on the modules under test.

\* \* \* \* \*